(12) United States Patent
Okazawa et al.

(10) Patent No.: US 6,674,663 B2
(45) Date of Patent: Jan. 6, 2004

(54) NONVOLATILE STORAGE DEVICE AND OPERATING METHOD THEREOF

(75) Inventors: Takeshi Okazawa, Kanagawa (JP); Yuukoh Katoh, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/319,961

(22) Filed: Dec. 16, 2002

(65) Prior Publication Data

US 2003/0112656 A1 Jun. 19, 2003

(30) Foreign Application Priority Data

Dec. 17, 2001 (JP) ......................................... 2001-383336

(51) Int. Cl.$^7$ ............................................... G11C 11/00
(52) U.S. Cl. .................. 365/158; 365/171; 365/230.07; 365/225.5
(58) Field of Search ................................ 365/158, 171, 365/230.06, 230.07, 225.5

(56) References Cited

U.S. PATENT DOCUMENTS

| | | | | |
|---|---|---|---|---|
| 6,034,887 A | * | 3/2000 | Gupta et al. ................. | 365/171 |
| 6,256,224 B1 | * | 7/2001 | Perner et al. ................ | 365/173 |
| 6,272,040 B1 | * | 8/2001 | Salter et al. ................. | 365/158 |
| 6,404,671 B1 | * | 6/2002 | Reohr et al. ................. | 365/158 |
| 6,490,217 B1 | * | 12/2002 | DeBrosse et al. ........ | 365/225.5 |

* cited by examiner

Primary Examiner—Richard Elms
Assistant Examiner—Tuan T. Nguyen
(74) Attorney, Agent, or Firm—Darryl G. Walker; Bradley T. Sako

(57) ABSTRACT

A nonvolatile storage device and method of operation capable of preventing opens in a word line and/or bit line that may result from electromigration is disclosed. A nonvolatile storage device according to an embodiment may include a number of magnetic resistance elements provided at intersections of word lines and bit lines, a word line control circuit for selecting one word line and supplying a write current thereto in a write operation, and a bit line control circuit for selecting one bit line and supplying a write current thereto. A word line control circuit can provide a bidirectional write current to a word line.

23 Claims, 7 Drawing Sheets

NONVOLATILE STORAGE DEVICE AND OPERATING METHOD THEREOF

TECHNICAL FIELD

The present invention relates generally to a nonvolatile storage devices and methods of operation such devices, and more particularly to a magneto-resistive random access memory (MRAM) that may include a magnetic resistance element as a storage element, and an operating method for such an MRAM.

BACKGROUND OF THE INVENTION

A magneto-resistive random access memory (MRAM) can typically utilize a magnetic-resistance (MR) element as a data storage element. Data can be written to a MR element by establishing a magnetic state for such an element. A change in the magnetic state of an MR element can correspond to a change in resistance for the MR element. Thus, data may be read from a MR element by detecting a voltage established by the resistance of a MR element.

Typically, the magnetic state of a MR element can be set or changed by establishing a magnetic field according to a current flowing within the vicinity of the MR element. In this way, data can be written to a MR element.

Read and write operations for a conventional nonvolatile storage device, such as a conventional MRAM, will now be described with reference to FIG. 15. In FIG. 15, a nonvolatile storage device 1500 may include a number of memory cells, one of which is shown as 1502. Each memory cell (e.g., 1502) of a nonvolatile storage device 1500 may include a metal-oxide-semiconductor (MOS) transistor (one of which is shown as 1504) and a magnetic resistance element (one of which is shown as 1506). A magnetic resistance element (e.g., 1506) can be connected between a MOS transistor (e.g., 1504) and a write word line WW. A magneto resistance element may be referred to herein in some cases as TMR. A nonvolatile storage device 1500 may also include a bit line BIT LINE that may intersect a write word line WW and a read word line READ WORD LINE in the vicinity of a TMR. A read word line READ WORD LINE can be parallel to a write word line WW.

In a conventional write operation, one of a number of write word lines can be selected. When a write word line is selected, a write current, generated by a current generating source, can flow through the write word line WW. Further, a bit line write current can flow through a bit line B to further effect data writing. A magnetic state of a magnetic resistance element 1506 can be set according to a synthetic magnetic field formed by currents supplied to a write word line WW and a bit line B. A magnetic state of a magnetic resistance element 1506 can be altered according to a direction of current flow within a bit line B. Thus, a current flow in one direction within bit line B can establish one particular data value, while a current flow in an opposite direction within bit line B can establish another data value. Current flow direction in a bit line can be varied by a bit line voltage.

In a conventional read operation, a read voltage (a power source voltage) is applied to a read word line WR in order to read data values. In addition, a voltage of about 0.5 volts (V) can be applied to a write word line. A magnetic state of a magnetic resistance element 1504 can determine the resistance of a magnetic resistance element for memory cell selected by a read word line WR. Thus, when the above voltages are established, the resistance of the selected magnetic resistance element can establish a bit line voltage. This bit line voltage can be detected to thereby determine a data value stored within a selected memory cell.

As described above, in a conventional nonvolatile storage device using a magnetic resistance element, data may be written by current flowing in a word line and bit line. Conventionally, a current flow direction in a word line may be the same regardless of a data value being written. In contrast, a bit line current flow direction will vary according to the data value written. Accordingly, conventional write operations can include consistent generation of a word line current that always flows in the same direction.

It is also noted that in a conventional nonvolatile storage device data values may be biased (the occurrence of one data value may be more likely than another). In such a case, a bit line current direction may be likewise biased to flow in one direction.

A drawback to the above conventional write current arrangements can arise from electromigration. When current flows in one direction, or is biased to flow in one direction, within a conductor, electromigration may cause discontinuities to occur in the conductor. Consequently, in a conventional nonvolatile storage device, bit lines and/or word lines can suffer from electromigration induced discontinuities, resulting in undesirably high resistance or even opens in such bit lines and/or word lines.

In other words, when current flows in a wiring, an opening can develop in such a wiring due to electromigration. In cases where current always flows in one direction, or is biased to flow in one direction, electromigration may progress at faster rates than other arrangements. Still further, conventional nonvolatile storage devices may be more susceptible to such adverse effects, as a relatively large current may be required to induce the necessary magnetic field for establishing the magnetic state of a magnetic material (like that included in a magnetic resistive element). That is, larger currents can result in greater electromigration effects.

In light of the above, it would be desirable to provide a nonvolatile storage device that may not be as susceptible to the adverse effects of electromigration like that described above. In particular, it would be desirable to arrive at a nonvolatile storage device having word lines and bit lines that may be prevented from forming openings that could otherwise occur in a conventional nonvolatile storage device. It would also be desirable to arrive at a method of operating a nonvolatile storage device that could include the above-mentioned benefits.

SUMMARY OF THE INVENTION

The present invention may include a nonvolatile storage device that includes a number of word lines, a number of bit lines, and a number of magnetic resistance elements provided at intersections of the word lines and bit lines. In addition, a word line control circuit can select one of the word lines in a write operation and supply a bidirectional word line write current to the selected word line. A bit line control circuit can select one of the bit lines in a write operation and supply a bit line write current to a selected bit line.

According to one aspect of the embodiments, in the write operation, a word line control circuit can provide a word line write current in one direction and then in a reverse direction.

According to another aspect of the embodiments, an amount of time a word line write current flows in the one direction can be essentially equal to an amount of time a word line write current flows in a reverse direction.

According to another aspect of the embodiments, a bit line control circuit can provide a bit line write current in one direction and then in a reverse direction.

According to another aspect of the embodiments, a bit line control circuit may include a word line—bit line connecting circuit that can connect a bit line to a word line in a write operation.

The present invention may also include a nonvolatile storage device having a number of word lines, a number of bit lines, and magnetic resistance elements provided at intersections of the word lines and bit lines. A word line control circuit can select one of the word lines and supply a word line write current to the selected word line in a write operation. A word line control circuit may reverse a word line write current based on previous word line write current directions. In addition, a bit line control circuit can select one of the bit lines in the write operation and supply a bit line write current to the selected bit line.

According to one aspect of the embodiments, a word line control circuit can include a counter that counts the number of times that a write current of one direction is supplied to a word line. When the count reaches a predetermined value, the word line control circuit can reset the counter count and reverse a word line write current direction.

According to another aspect of the embodiments, a word line control circuit can include a counter that adds or subtracts a count value according to a direction of a word line write current. When the absolute value of the count reaches a predetermined value, a word line write current can be provided for a predetermined number of times for a predetermined duration to bring a count value to about zero.

According to another aspect of the embodiments, a word line control circuit can store a direction of a word line write current supplied to a word line. A word line control circuit may then reverse a word line write current direction in a next write operation.

According to another aspect of the embodiments, a nonvolatile memory device may also include a switching device corresponding to each word line. A switching device can selectively connect a word line to a predetermined supply potential.

The present invention may also include a method of operating a nonvolatile storage device. Such a method may include the steps of supplying a bidirectional word line write current to a word line selected by a word line control circuit when writing data to a magnetic resistance element formed at an intersection of the word line and a bit line. The method may also include supplying a bit line write current to the bit line, the bit line being selected by a bit line control circuit.

According to one aspect of the embodiments, supplying a bit line write current includes supplying a bit line with a bit line write current in one direction and then supplying a bit line write current in the reverse direction in a same write operation.

According to another aspect of the embodiments, supplying a bidirectional word line write current can include supplying a word line with a word line write current in one direction and then supplying a word line write current in a reverse direction in the same write operation.

According to another aspect of the embodiments, supplying a bidirectional word line write current can include supplying a word line with a word line write current in one direction prior to supplying a bit line write current.

According to another aspect of the embodiments, supplying a bidirectional word line write current includes coupling a word line to a bit line to supply a bit line write current.

The present invention may also include a method of operating a nonvolatile storage device that includes switching a direction of a word line write current in a write operation based on at least one previous word line write current direction when writing data to a magnetic resistance element formed at an intersection of the word line and a bit line. The method may also include supplying a bit line write current to a bit line, the bit line being selected by a bit line control circuit.

According to one aspect of the embodiments, switching a direction of a word line write current can include counting a number of times that a word line write current flows in one direction, and when the count reaches a predetermined value, resetting a counter count and switching a direction of the word line write current.

According to another aspect of the embodiments, a step of switching a direction of the word line write current can include storing a direction of a word line write current supplied to a word line and reversing a word line write current direction in a next write operation.

According to another aspect of the embodiments, supplying a bit line write current to a bit line includes supplying a bit line write current in one direction to a first bit line of a bit line pair and providing a bit line write current in an opposite direction to a second bit line of a bit line pair.

According to another aspect of the embodiments, a method may include, in a read operation, coupling a bit line to one terminal of a sense amplifying circuit and then writing a predetermined data value with a bidirectional word line current to the bit line, and coupling the bit line to another terminal of the sense amplifying circuit.

DETAILED DESCRIPTION OF THE EMBODIMENTS

Various embodiments of the present invention will now be described in detail with reference to a number of drawings.

Figure 1:
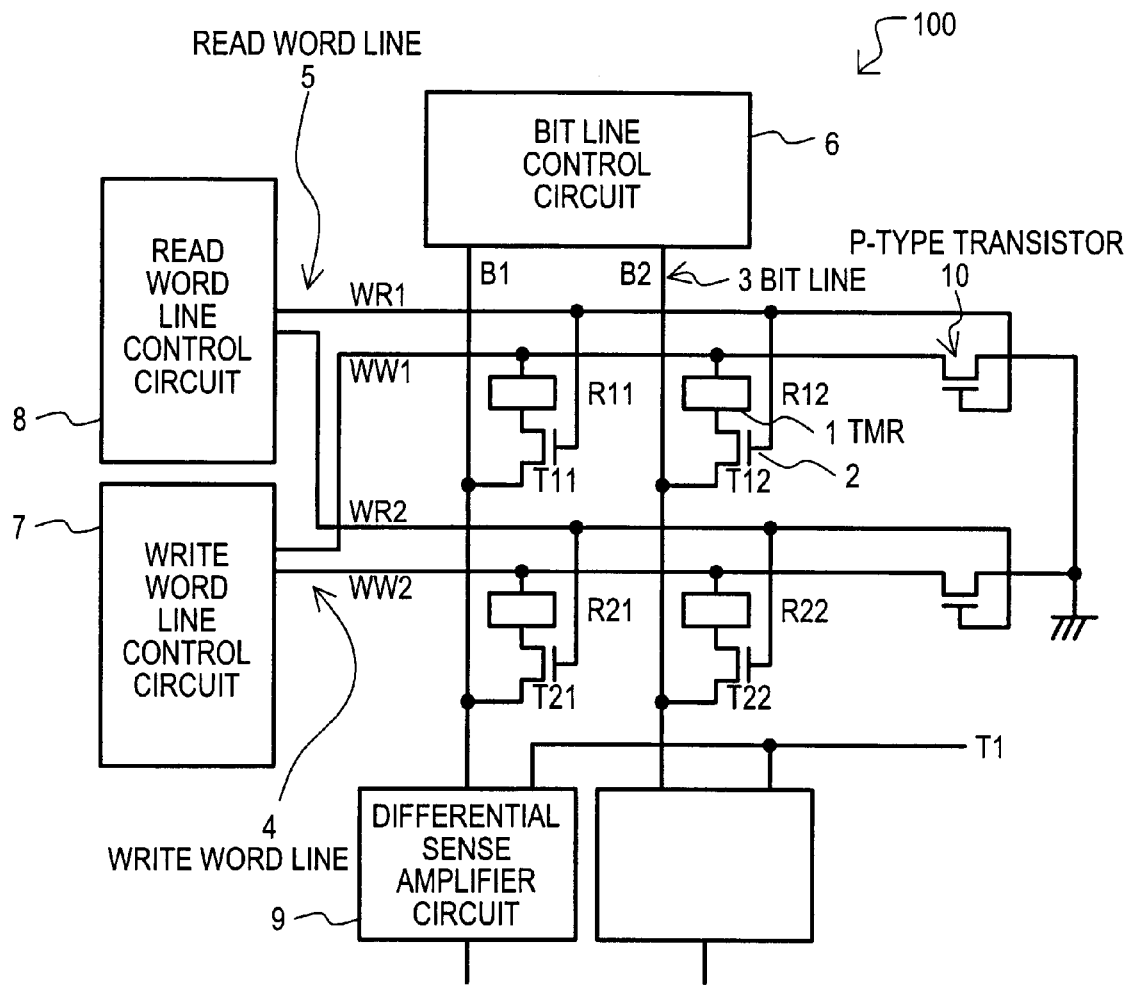
FIG. 1 is a block diagram of a first embodiment of the present invention.

Referring now to FIG. 1, a nonvolatile storage device according to one embodiment is set forth in a block diagram and designated by the general reference character 100. A nonvolatile storage device 100 may include a magnetic resistance element TMR (R11 to R22) 1, a transistor (T11 to T22) 2, a bit line (B1 to B2) 3, a write word line (WW1 to WW2) 4, and a read word line (WR1 and WR2) 5. A read word line (WR1 and WR2) 5 can be parallel to a write word line (WW1 to WW2) 4. A bit line (B1 to B2) 3 can intersect write word line (WW1 to WW2) 4 and/or read word line (WR1 and WR2) 5 in the vicinity of a corresponding magnetic resistance element TMR 1. A transistor (T11 to T22) 2 may be an insulated gate field effect transistor, more particularly an n-type metal-oxide-semiconductor (MOS) transistor.

A nonvolatile storage device 100 may further include a bit line control circuit 6, a write word line control circuit 7, a read word line control circuit 8, a differential sense amplifier circuit 9, and a switching transistor 10. A switching transistor 10 may be an insulated gate field effect transistor, more particularly a p-type MOS transistor.

Various connections between items of a nonvolatile storage device 100 will now be described. Referring to FIG. 1, a magnetic resistance element R12 TMR 1 can have one electrode connected to a source of transistor T12 2 and another electrode connected to a write word line WW1 4. Transistor T12 2 may have a drain connected to a bit line B2 3 and a gate connected to a read word line WR1 5.

A bit line control circuit 6 may be connected to one end of a bit line B2 3 and a differential sense amplifier 9 may be connected to another end of a bit line B2 3. A bit line control circuit 6 can control a connection and a disconnection of bit lines to a number of voltages, including ground. According to connection arrangements, a bit line control circuit 6 may provide for bidirectional current flow through a bit line B2 3.

A write word line control circuit 7 can be connected to one end of a write word line (WW1 to WW2) 4. Unlike conventional approaches, a write word line control circuit 7 can provide bidirectional current flow within a write word line (WW1 to WW2) 7.

A read word line control circuit 8 can be connected to one end of a read word line (WR1 to WR2) 5. A read word line control circuit 8 can control a potential for a read word line (WR1 to WR2) 5.

A differential amplifier circuit 9 may have one input connected to a bit line B2 3. A reference voltage can be applied to another input of differential amplifier circuit 9 by way of a terminal T1.

A magnetic resistance element TMR 1 can have a uniaxial magnetic anisotropy with a direction substantially the same as a field generated by flowing current through a bit line 3.

Figure 2:
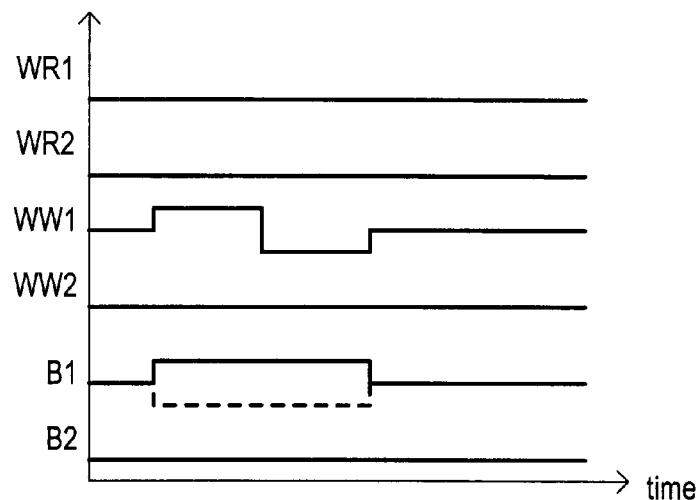
FIG. 2 is a timing diagram showing a write operation of a first embodiment.

Having described various features of the embodiment illustrated in FIG. 1, the operation of the nonvolatile storage device 100 will now be described. First, a method of writing data to a magnetic resistance element will be described with reference to FIG. 2. FIG. 2 is a timing diagram that illustrates waveforms for read word lines (WR1 and WR2), write word lines (WW1 and WW2), and bit lines (B1 and B2).

Referring to FIG. 1 in conjunction with FIG. 2, it will be assumed that data is to be written into magnetic resistance element R11. In such a write operation, a read word line WR1 potential may be set to low voltage (0 V) to place memory cell transistor T11 into an essentially non-conducting state (OFF) and switching transistor 10 into a conducting state (ON). A write current may then flow from a write word line control circuit 7 through write word line WW1 4. Such a write current may be in the order of several milliamperes (mA). At the same time, a write word line WW2 may be disconnected from a write potential, thereby preventing a write current from flowing therethrough.

In the same write operation, a write current may flow from a bit line control circuit 6 into a bit line B1 to induce a magnetic field for writing data. Such a write current can be in the order of several mA, and can be established by raising (or lowering) a bit line potential. Thus, FIG. 2 shows a voltage for bit line B1 being either raised or lowered (shown by a dashed line). At the same time, another bit line (one that is not to writing data) can be disconnected from write potential or set to a ground voltage level. A time at which currents flow through a write word line and bit line can be different, or can be essentially simultaneous.

A magnetic state of a magnetic resistance element R11 can be set according to a synthetic magnetic field generated by a current supplied to write word line WW1 and a bit line B1. When a current flow through a bit line B1 is one direction, a magnetic resistance element R11 can be set to one magnetic state, and therefore have one resistance value. However, when a current flow through a bit line B1 is in another (e.g., opposite) direction, a magnetic resistance element R11 can be set to a different magnetic state, and therefore have a different resistance value. In this way a resistance of a magnetic resistance element R11 may vary according to a magnetic direction.

Unlike conventional approaches, in a write operation, a write word line control circuit 7 may make current flowing in a write word line WW1 switch directions. Thus, in the write operation shown in FIG. 2, a potential of a write word line WW1 may change, resulting a current flow within write word line WW1 switching direction. Preferably, current flow duration for such opposite directions can be essentially the same (e.g., within ±10% of one another). A change in current flow direction is shown in FIG. 2 by a potential of write word line WW1 switching from a high level to a low level. After switching direction for a predetermined amount of time, current flow within a write word line may be stopped. This is shown in FIG. 2 by a potential of write word line WW1 returning a same value established prior to a write operation.

It is noted that a bit line current for a write operation may be stopped before or after a write word line current is reversed.

Figure 3:
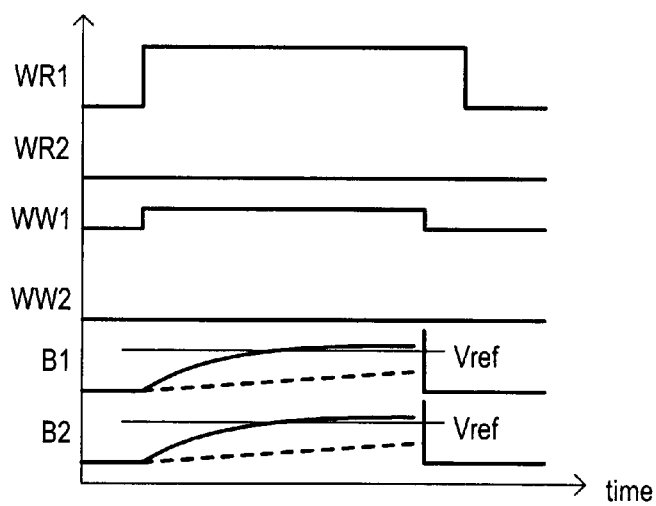
FIG. 3 is a timing diagram showing a read operation of a first embodiment.

Having described one example of a method of writing data to a magnetic resistance element, a method of reading data from such a magnetic resistance element will now be described with reference to FIG. 3. FIG. 3 is a timing diagram that illustrates the same various waveforms as FIG. 2.

Referring to FIG. 1 in conjunction with FIG. 3, it will be assumed that data is to be read from magnetic resistance elements R11 and R12. In such a read operation, a read word line WR1 potential may be set to high voltage (e.g., a supply voltage) to place memory cell transistors T11 and T12 2 into a conducting state (ON) and switching transistor 10 into an essentially non-conducting state (OFF). At the same time, read word line WR2 may be set to low voltage (e.g., 0 V) to place memory cell transistors T21 and T22 into an essentially non-conducting state (OFF).

As shown in FIG. 3, in a same read operation, a write word line control circuit 7 can supply a predetermined voltage to the write word line WW1 corresponding to a selected read word line WR1. As but one example, such a predetermined voltage can be about 0.5 V.

In a read operation, bit lines B1 and B2 may be initially grounded by bit line control circuit 6, but then set to a floating state. Following some delay, a differential sense amplifier circuit 9 can be operated. Such a delay can be about 10 microseconds ($\mu$s). When operated, a differential sense amplifier circuit 9 can determine if a potential of a bit line B1 is greater than or less than a reference potential provided at terminal T1. According to such a determination, a differential sense amplifier circuit 9 can provide one output value (e.g., a power source voltage) or another (e.g., a ground potential). In this way, a stored data value can be determined, and a read operation may be completed.

Bit line voltages that can result in a differential sense amplifier 9 outputting one output value (e.g., a power source voltage) are shown in FIG. 3 by solid lines for bit line responses B1 and B2. Bit line voltages that can result another output value (e.g., ground voltage) are shown in FIG. 3 by dashed lines for bit line responses B1 and B2.

Figure 4:
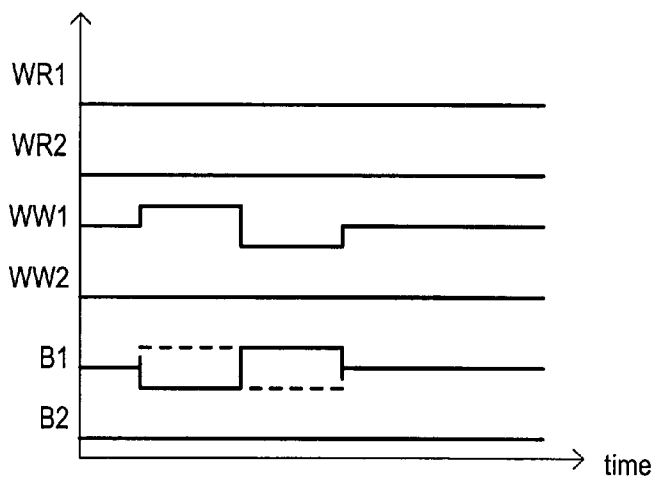
FIG. 4 is a timing diagram showing a write operation of a second embodiment.

Having described the structure and operation of a first embodiment, a second embodiment will now be described with reference to FIGS. 1 and 4. FIG. 4 is a timing diagram showing the same waveforms as FIGS. 2 and 3. A nonvolatile storage device according to a second embodiment may have the same general items as that of a first embodiment 100.

Referring to FIG. 1 in conjunction with FIG. 4, it will be assumed that data is to be written into magnetic resistance element R11. In a write operation according to a second embodiment, a read word line WR1 potential may be set to low voltage (0 V) to place memory cell transistor T11 into an essentially non-conducting state (OFF) and switching transistor 10 into a conducting state (ON).

A write current may then flow from a bit line control circuit 6 into a bit line B1. After a predetermined first time period, such a write current within bit line B1 can change flow direction. Such a predetermined first time period may be about 10 nanoseconds (ns). Such a reverse current flow within a bit line B1 may then stop after a predetermined second time period. Such a predetermined second time period may also be about 10 ns. A bit line write current according to a second embodiment can be in the order of several mA. Further, a same current magnitude is preferable in both flow directions. Along these same lines, while first and second predetermined time periods are described as equal, such time periods can be different. Changes in bit line write current direction are shown in FIG. 4 by a potential of bit line B1 switching from an intermediate potential to a one potential (e.g., high or low), from the one potential to another potential (e.g., low or high), and then returning an intermediate potential.

A write operation according to a second embodiment may also include a write current flowing through a write word line WW1. In particular, a current may start to flow through a write word line WW1 at a time before a write current flows through a bit line B1 or before a current flow direction for a bit line B1 is changed (reversed). After a write current starts flowing through a write word line WR1, such a current may be reversed in direction and then stopped. Reversal of a write word line WR1 current may occur at various times following the start of such a write current.

In a second embodiment, a current flowing through a write word line WW1 may be stopped at any time after a current direction in a bit line B1 is reversed. Also, a write current flow for a bit line B1 and write word line WW1 should be of sufficient duration to write data into a magnetic resistance element. A current magnitude of such a word line current is preferably the same in both flow directions. In addition, the amount of time that current flows in both directions with a word line preferably the same.

Since the direction of bit line current is changed in the second embodiment, the data programmed during the first period is not equal to that programmed during the second period. However, that is no problem. That is, the first period is a dummy period on purpose to flow reversed currents in word and bit lines to store a dummy data. True data is programmed into the cell during second period.

Figure 5:
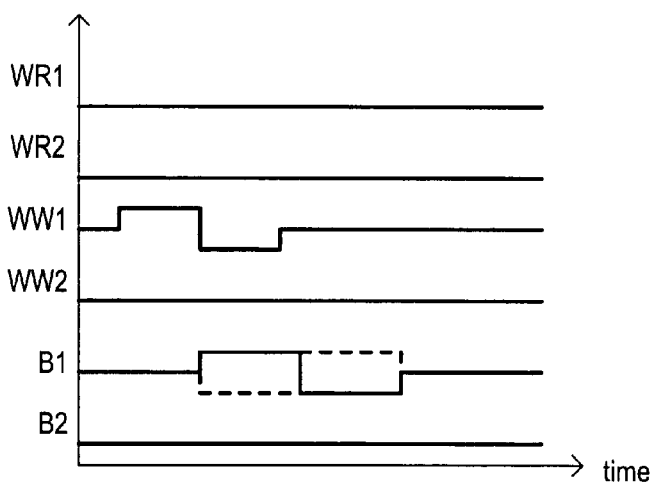
FIG. 5 is a timing diagram showing a write operation of a third embodiment.

A write operation according to a third embodiment will now be described with reference to FIGS. 1 and 5. FIG. 5 is a timing diagram showing the same waveforms as FIGS. 2 to 4. A nonvolatile storage device according to a third embodiment may have the same general items as that of a first embodiment 100.

Referring to FIG. 1 in conjunction with FIG. 5, it will again be assumed that data is to be written into magnetic resistance element R11. In a write operation according to a third embodiment, a read word line WR1 potential may be set to low voltage (0 V) to place memory cell transistor T11 into an essentially non-conducting state (OFF) and switching transistor 10 into a conducting state (ON).

A write current may then be established in a bit line B1 in the same general fashion as the second embodiment. That is, a write current can flow from a bit line control circuit 6 into a bit line B1. Such a write current may flow for about 10 ns and then reverse direction for about 10 ns. A bit line write current magnitude can be several mA, and may preferably have a same current magnitude in both flow directions. A time period for current flow directions may also be the same.

A write operation according to a third embodiment may also include a write current flowing through a write word line WW1. Such a current flow may start any time before a write current begins to flow in a bit line B1, or before a current flow direction within B1 is reversed. After a write current starts flowing through a write word line WR1, such a current may be reversed in direction and then stopped. Reversal of a write word line WR1 current may occur at various times following the start of such a word line write current. Further, a current flowing through a write word line WW1 may be stopped at any time before a current direction in a bit line B1 is reversed, and provided current flow in a bit line B1 and a write word line WW1 is of sufficient duration to write data into a magnetic resistance element. A current magnitude of such a word line current is preferably the same in both flow directions. In addition, the amount of time that current flows in both directions is preferably the same.

Changes in write word line WW1 current direction are shown in FIG. 5 by a potential of write word line WW1 switching from an intermediate potential to a high potential prior to a write current being started in bit line B1. Further, a potential of write word line WW1 may switch from a high potential to a low potential. A potential of write word line WW1 may then return to an intermediate potential prior to a potential of bit line B1 switching from a first value (e.g., high or low) to a second potential (e.g., low or high).

That is, this embodiment of the present invention has three periods for a programming. The first and third periods are dummy periods to flow reversed currents in word and bit lines.

The various first through third embodiments have illustrated arrangements in which current may flow through a word line and/or bit line in a bidirectional fashion. Wires that are subject to a bidirectional current flow according to the present invention may have overwhelmingly longer service life than conventional arrangements. As will be recalled, conventional arrangements may subject wiring to unidirectional or "biased" current flow. In this way, the service life of write word lines and/or bit lines can be greatly improved over conventional approaches.

Figure 6:
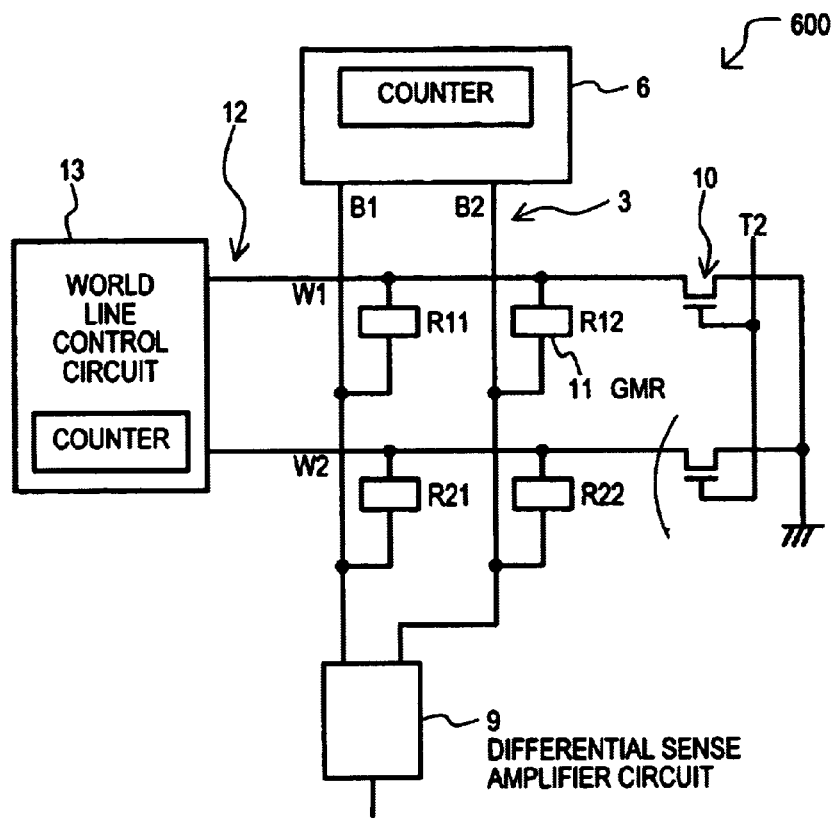
FIG. 6 is a block diagram of a fourth embodiment of the present invention.

A fourth embodiment will now be described with reference to FIG. 6. Referring now to FIG. 6, a nonvolatile storage device according to one embodiment is set forth in a block diagram and designated by the general reference character 600. A nonvolatile storage device 600 may include an element GMR (R11 to R22) 11, a bit line (B1 to B2) 3, and a word line (W1 to W2) 12. A bit line (B1 to B2) 3 can intersect a word line (W1 to W2) 12 in the vicinity of a GMR 11. A GMR (R11 to R22) 11 may be a magnetic resistance element, including a "giant" magnetic resistance element.

A nonvolatile storage device 100 may also include a bit line control circuit 6, a word line control circuit 13, a differential sense amplifier circuit 9, and a switching transistor 10.

Various connections between items of a nonvolatile storage device 600 will now be described. Referring to FIG. 6, a GMR R12 11 can have one electrode connected to a bit line B2 3 and another electrode connected to a word line W1 12. A bit line control circuit 6 may be connected to one end of a bit line B2 3. A differential sense amplifier 9 may be connected to other ends of bit lines B1–B2 3. A bit line control circuit 6 can control a connection and a disconnection of bit lines to a number of voltages, including ground. According to connection arrangements, a bit line control circuit 6 may provide for bidirectional current flow through a bit line B2 3. Further, a bit line control circuit 6 may maintain a count for each bit line that reflects a difference in the number of times a current has flowed through a bit line in one direction with respect to the number of times a current has flowed through the bit line in an opposite direction.

A word line control circuit 13 can be connected to one end of a word line (W1 to W2) 12. A word line control circuit 13 can control a connection and a disconnection of word lines (W1 to W2) 12 to a number of voltages, including ground. Unlike conventional approaches, a word line control circuit 12 can also provide bidirectional current flow within a word line (W1 to W2) 12. Still further, a word line control circuit 13 may maintain a count for each word line that reflects a number of times a current has flowed through a word line in one direction.

Word lines (W1 to W2) 12 may also have an end connected to ground through a switching transistor 10. Switching transistors 10 may be commonly controlled according to a potential applied at a terminal T2.

As shown in FIG. 6, adjacent bit lines B1 and B2 may be provided as inputs to a differential amplifier circuit 9.

A GMR 11 can have a uniaxial magnetic anisotropy with a direction substantially the same as a field generated by flowing current through a bit line 3.

Figure 7:
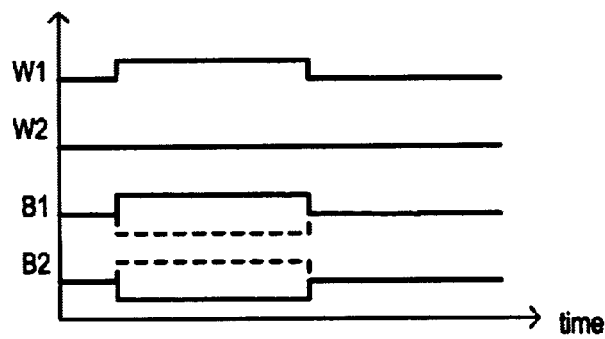
FIG. 7 is a timing diagram showing a write operation according to a fourth embodiment.

Having described various features of a fourth embodiment, the operation of a fourth embodiment nonvolatile storage device 600 will now be described. First, a method of writing data to a GMR will be described with reference to FIG. 7. FIG. 7 is a timing diagram that illustrates waveforms for word lines (W1 and W2) and bit lines (B1 and B2).

Referring to FIG. 6 in conjunction with FIG. 7, it will be assumed that data is to be written into pairs of GMRs R11/R12 in a complementary fashion. In such a write operation, a voltage can be applied to a terminal T2 to place switching transistor 10 into a conducting state (ON). A write current may then flow from a word line control circuit 13 through word line W1 12 in order to induce a magnetic field for writing data. Such a write current may be in the order of several mA. At the same time, a word line W2 may be disconnected from a write potential, thereby preventing a write current from flowing therethrough.

In the same write operation, a write current may flow between bit line control circuit 6 and bit lines B1 and B2 to induce a magnetic field for writing data. Other bit lines can be disconnected from write potential or set to a ground voltage level.

Current directions in bit lines B1 and B2 in a fourth embodiment may be opposite to one another. In this way, complementary data may be stored in two GMRs R11 and R12. That is, one data value may be stored by two GMRs. The duration of a write current flow in bit lines B1 and B2 with respect to a current flow in a word line W1 can be the same, or can be different.

A magnetic state of GMRs R11 and R12 can be set according to a synthetic magnetic field generated by a current supplied to word line W1 and a bit line (B1 or B2). When a current flow through a bit line B1 is one direction, a magnetic resistance element R11 can be set to one magnetic state, and therefore have one resistance value. At the same time a current flow through bit line B2 can be in another (e.g. opposite) direction, and a magnetic resistance element R12 can be set to a different magnetic state, and therefore have a different resistance value. Such opposite current directions for adjacent bit lines B1 and B2 3 are shown in FIG. 7 by bit line responses B1 and B2 being driven to opposite levels while a word line response W1 is high.

In this way a resistance of magnetic resistance elements R11 to R22 may vary according to a magnetic direction.

After a time period required for writing data has passed, a current flowing in a word line W1 12 and bit lines B1 and B2 3 can be stopped. The stopping time for such currents may be the same, or may be different.

In one approach, within a word line control circuit 13, a counter may update a count value according to a current flow direction. A word line control circuit 13 may allow current to flow in one direction within a word line W1 12 for a predetermined number of times. Once such a predetermined number is reached, a current flow direction for such a word line W1 12 may be reversed, and a count value may be reset.

Alternatively, within a word line control circuit 13 a counter may assign a value of "0" or "1" that reflects a current direction for a word line. The next time current flows through a word line in a write operation, a current direction may be opposite, and a counter may assign an opposite value of "1" or "0" for the word line.

Figure 8:
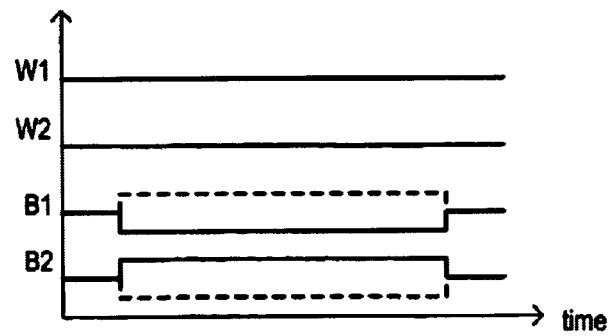
FIG. 8 is a timing diagram showing an operation for compensating for current flow direction in a bit line according to an embodiment.

In a fourth embodiment, within a bit line control circuit 6, a counter may dedicate a count value for each bit line pair. Thus, one current flow direction for a bit line pair (e.g., current into B1 and out of B2) may result in a count value being incremented by +1. However, an opposite current flow direction (e.g., current out of B1 and into of B2) may result in a count value being decremented by −1. A bit line control circuit 6 may monitor a count value to detect when the absolute count value reaches a predetermined number. When an absolute count value reaches a predetermined value, a bit line control circuit may cause current to flow in the opposite direction within a bit line pair to the direction that has contributed to the count. Such operations may continue until a count value returns to 0. Such an operation is shown in FIG. 8, which shows bit line responses B1 and B2 being driven to opposite levels while all word line responses W1 and W2 are low.

A memory cell, such as that including a GMR, may be utilized to store count values in a bit line control circuit 6 and/or a word line control circuit 13. In addition, or alternatively, a volatile circuit may store such values. Such a volatile circuit may be like those included in a memory cell of a static random access memory (SRAM), as but one example.

Figure 9:
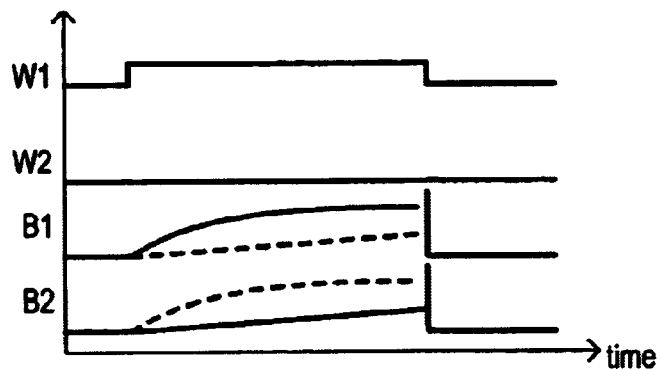
FIG. 9 is a timing diagram showing a read operation according to one embodiment.

Having described one example of a method of writing data to GMR pairs, a method of reading data from such GMR pairs will now be described with reference to FIG. 9. FIG. 9 is a timing diagram that illustrates the same various waveforms as FIGS. 7 and 8.

Referring to FIG. 6 in conjunction with FIG. 9, in a read operation according to a sixth embodiment, a voltage can be applied to a terminal T2 to place switching transistor 10 into an essentially non-conducting state (OFF). A word line control circuit 13 can supply a predetermined voltage to a word line W1. As but one example, such a predetermined voltage can be about 0.5 V. Non-selected word lines W2 can be set to a ground state by a word line control circuit 13.

In a read operation, bit lines B1 and B2 may be initially grounded by bit line control circuit 6, but then set to a floating state. Following some delay, a differential sense amplifier circuit 9 can be operated. Such a delay can be about 10 μs. When operated, a differential sense amplifier circuit 9 can determine a difference in a potential between bit line pairs B1 and B2. According to such a determination, a differential sense amplifier circuit 9 can provide one output value (e.g., a power source voltage) or another (e.g., a ground potential). In this way, a stored data value can be determined, and a read operation may be completed.

Bit line voltages that can result in a differential sense amplifier 9 outputting one output value (e.g., a power source voltage) are shown in FIG. 9 by solid lines for bit line responses B1 and B2 reflecting the reading of on data value. Dashed lines in FIG. 9 show the reading of a different data value.

In the fourth embodiment described, a percentage by which current flows within a word line and/or bit line can be set to a predetermined range. Consequently, there may be essentially no bias with respect to current direction flow in such lines. In this way, a service life of a word line and/or bit line may be greatly improved over conventional arrangements. Still further, in a fourth embodiment, additional current flow can occur only when a flow bias is corrected. This may enable write operations to continue at high speed, as a current flow in one direction need not be immediately followed by a current flow in an opposite direction.

Figure 10:
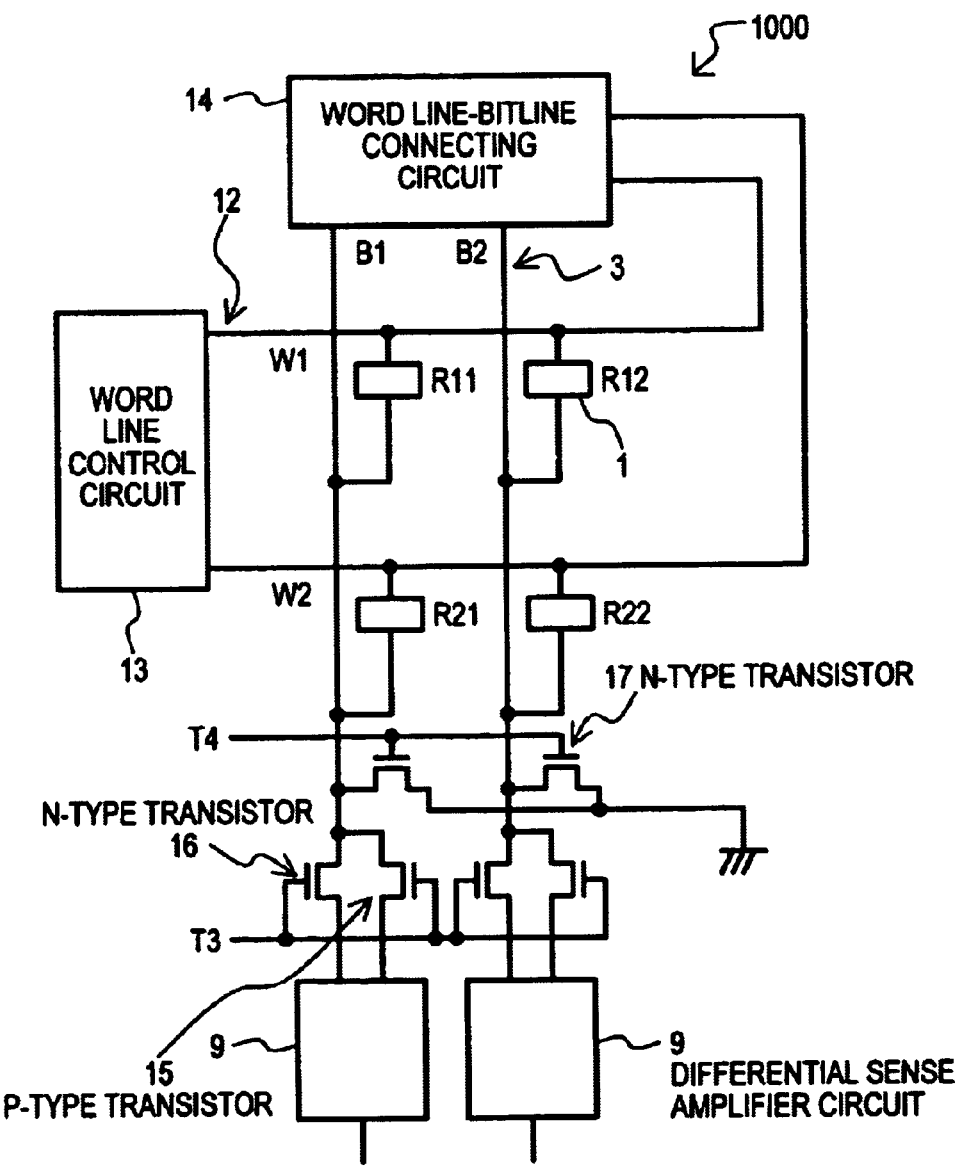
FIG. 10 is a block diagram of a fifth embodiment of the present invention.

A fifth embodiment will now be described with reference to FIG. 10. Referring now to FIG. 10, a nonvolatile storage device according to one embodiment is set forth in a block diagram and designated by the general reference character 1000. A nonvolatile storage device 1000 may include elements TMR (R11 to R22) 1, a bit line (B1 to B2) 3, and a word line (W1 to W2) 12. A TMR (R11 to R22) 1 may be a magnetic resistance element, including a "tunneling" magnetic resistance element.

A nonvolatile storage device 100 may also include a word line control circuit 13, a differential sense amplifier circuit 9, a word line—bit line connecting circuit 14, first type transistors 15, and second type transistors 16 and 17. First type transistors can be p-type MOS transistors, while second type transistors (16 and 17) can be n-type MOS transistors.

Various connections between items of a nonvolatile storage device 1000 will now be described. Referring to FIG. 10, a TMR R12 1 can have one electrode connected to a bit line B2 3 and another electrode connected to a word line W1 12. A word line—bit line connecting circuit 14 may be connected to one end of a bit line B2 3. Another end of a bit line (e.g., B1) can be connected to a drain of a first type transistor 15 and second type transistors 16 and 17. A second type transistor 17 can have a source connected to a ground potential and a gate connected to a terminal T4. A first type transistor 15 may have a source connected to one input of a differential sense amplifier circuit 9 and a gate connected to a terminal T3. A second type transistor 16 may have a source connected to another input of a differential sense amplifier circuit 9 and a gate connected to a terminal T3.

A word line control circuit 13 can be connected to one end of a word line (W1 to W2) 12. A word line control circuit 13 can control a connection and a disconnection of word lines (W1 to W2) 12 to a number of voltages, including ground. Unlike conventional approaches, a word line control circuit 12 can also provide bidirectional current flow within a word line (W1 to W2) 12. Word lines (W1 to W2) 12 may also have an end connected to a word line—bit line connecting circuit 14.

A TMR 1 can have a uniaxial magnetic anisotropy with a direction substantially the same as a field generated by flowing current through a bit line 3.

Figure 11:
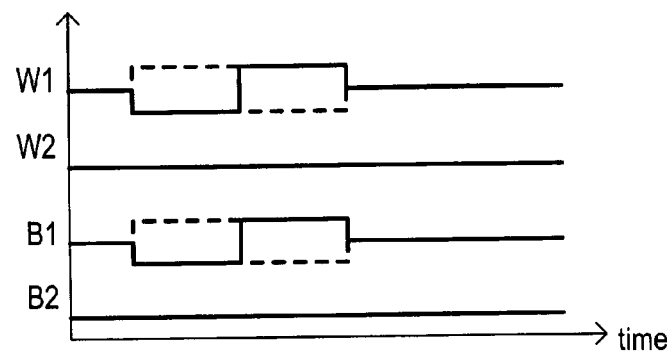
FIG. 11 is a timing diagram showing a write operation according to one embodiment.

Having described various features of a fifth embodiment, the operation of a fifth embodiment nonvolatile storage device 1000 will now be described. First, a method of writing data to a TMR will be described with reference to FIG. 11. FIG. 11 is a timing diagram that illustrates waveforms for word lines (W1 and W2) and bit lines (B1 and B2).

Referring to FIG. 10 in conjunction with FIG. 11, it will be assumed that data is to be written into a TMR R11. In such a write operation, a word line W1 and a bit line B1 can be connected by word line—bit line connecting circuit 14. A word line W2 and bit line B2, corresponding to memory cells that are not being written with data, can be set to a ground state. A power source voltage can be applied to a terminal T4. This can place second type transistors 17 into a conducting state (ON). Such an arrangement can result in a current flowing in a word line W1 12 for writing data. Such a write current may be in the order of several mA. After a current has flowed within a word line W1 for sufficient time for a writing operation, such a current direction may be reversed.

At the same time, the above arrangement can result in a current flowing through a bit line B1 by way of word line—bit line connecting circuit 14. Such a current flow may reverse direction and flow according to a current in word line W1 12.

Such essentially simultaneous current flows and direction changes are shown in FIG. 11 by voltages of word line W1 and bit line B1 which can transition from an intermediate potential to a first potential (e.g., high or low), to a second potential (e.g., low or high), back to an intermediate potential.

A magnetic state of TMR R11 can be set according to a synthetic magnetic field generated by a current supplied to word line W1 and bit line B1. When a current flows through a bit line B1 is one direction, a magnetic resistance element R11 can be set to one magnetic state. When a current flows through a bit line B1 in another (e.g. opposite) direction, a magnetic resistance element R11 can be set to a different magnetic state. In this way a resistance of magnetic resistance element R11 may vary according to a magnetic direction.

Figure 12:
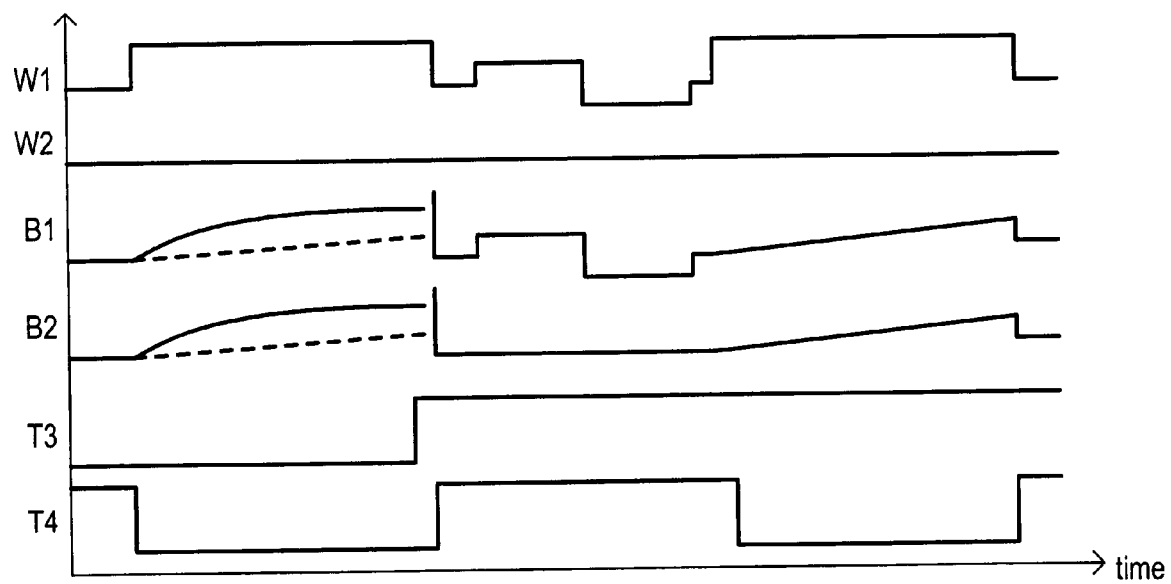
FIG. 12 is a timing diagram showing a read operation according to one embodiment.

Having described one example of a method of writing data according to a fifth embodiment, a read operation for such an embodiment will now be described with reference to FIG. 12. FIG. 12 is a timing diagram that shows the same various waveforms as FIG. 11, but also includes waveforms for potentials at terminals T3 and T4.

Referring to FIG. 10 in conjunction with FIG. 12, in a read operation, a word lines and bit lines may be disconnected from one another by word line—bit line connecting circuit 14. A word line control circuit 13 can supply a predetermined voltage to a word line W1 corresponding to a read data. As but one example, such a predetermined voltage can be about 0.5 V. Word lines W2 not corresponding to read data may be set to a ground state.

In a read operation, a voltage can be supplied to a terminal T4 to place second type transistors 17 into a conducting state (ON). For example, second type transistors 17 can be n-type MOS transistors and a power source voltage can be supplied to a terminal T4. Such an arrangement is shown in FIG. 12. In this way, bit lines B1 and B2 3 can be grounded.

Subsequently, a terminal T3 can be at a potential that places first type transistors 15 into a conducting state (ON) and second type transistors 16 into an essentially non-conducting state (OFF). As but one example, first type transistors 15 can be p-type MOS transistors, second type transistors 16 can be n-type MOS transistors, and a ground voltage can be supplied to a terminal T3. Such an arrangement is shown in FIG. 12.

A terminal T4 may then switch to a ground potential, turning second type transistors 17 off. This can place bit lines B1 and B2 3 into a floating state. As shown in FIG. 12, in such a state, bit lines B1 and B2 3 can rise to a potential based on a magnetic state of corresponding TMRs R11 or R12, respectively. In FIG. 12, one data value response for TMRs is represented by a solid line, while another possible response is represented by a dashed line. After a predetermined delay, a terminal T3 may rise to a high potential, thereby turning off first type transistors 15 and turning off second type transistors 16. Such a predetermined delay may be about 10 μs. In this way, a potential at one input terminal of sense amplifier circuit 9 may reflect a data value stored in a TMR R11.

Next, the read operation illustrated by FIG. 12 can continue with a write operation that writes a data value of "0" to a TMR R11. Such a write operation may occur as described above. However, data may then be read after such an operation. During such "pre-read" write operation, a terminal T3 can be at a power source potential as described above. Such a "pre-read" write operation is shown n FIG. 12 by word line response W1 and bit line response B1 transitioning while terminal T4 is at a power source value. In this way, while a potential at one input terminal of sense amplifier circuit 9 reflects a data value stored in a TMR R11, a potential at another input terminal can reflect a data value of "0."

As noted above, following such transitions a read may take place. In particular, after a predetermined delay, a differential sense amplifier 9 may be activated. Such a predetermined delay may be about 10 μs. When activated, according to a magnitude between two received potentials, a differential sense amplifier 9 can provide one output value (e.g., a power source voltage) or another (e.g., a ground potential). In this way, a stored data value can be determined, and a read operation may be completed.

It is noted that a differential sense amplifier 9 may have an input voltage sensitivity that is not balanced between input terminals so that data values of "0" can be determined. That is, a potential at one terminal of sense amplifier circuit 9 reflecting a data value of "0" stored in a TMR R11 can be different from a potential at the other input terminal formed by writing a value of "0."

It is also noted that a data value from a TMR R12 on another bit line B2 may be read at the same time as a data value from a TMR R11. In such an operation, a data value of "0" may be written to R12 after being written to R11. Subsequently, data may be read simultaneously for both R11 and R12.

In a fifth embodiment, the percentage of time that current flows in opposite directions in a word line and bit line can be set to the same essential value. Thus, a service life of word lines and bit lines may be greatly improved over conventional arrangements. Further, in a fifth embodiment, a bit line current source may be unnecessary, reducing device area. In addition, exclusion of a bit line current source may reduce power consumption by about half.

Figure 13:
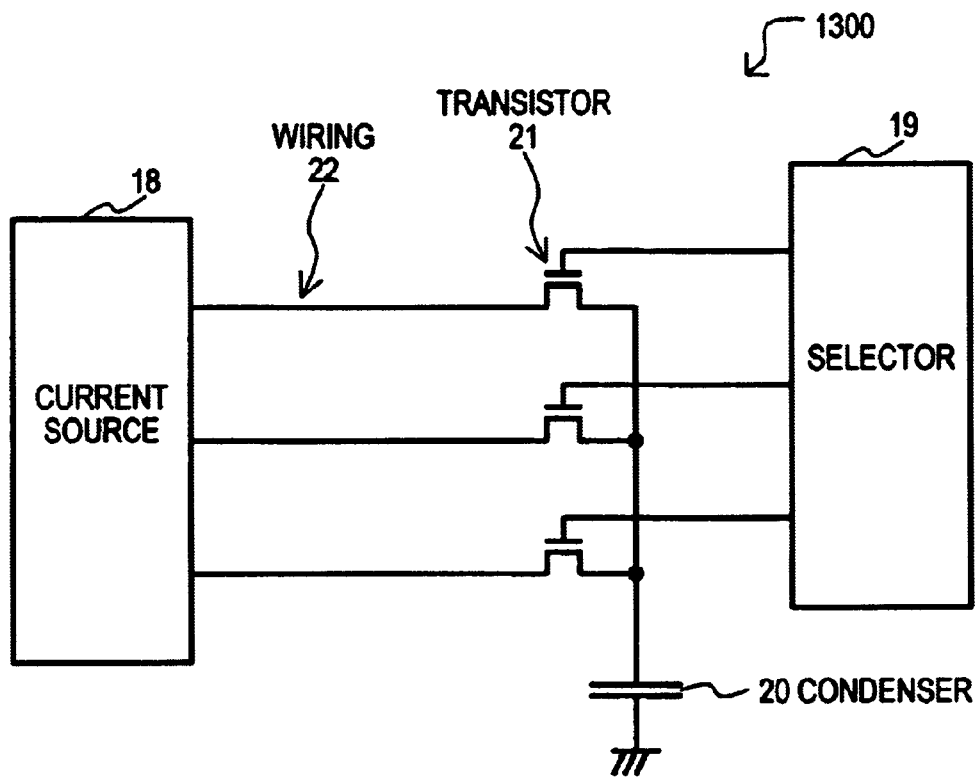
FIG. 13 is a block diagram of a sixth embodiment of the present invention.

A structure of a sixth embodiment will now be described with reference to FIG. 13. A sixth embodiment 1300 shows a bidirectional current generating circuit that includes a current source (or voltage source) 18, a selector 19, a condenser (capacitor) 20, and a number of transistors 21, which can be n-type MOS transistors. A sixth embodiment 1300 may also include a wiring 22 having a number of wires with one end connected to a current source 18 and another end connected to capacitor 20 by a corresponding transistor 21. A gate of each transistor 21 may be connected to a selector 19. A current source 18 can select a wire to enable a current to flow therethrough. A current source 18 may also provide a ground connection.

An operating method of a sixth embodiment will now be described. A selector 19 may apply a voltage to a gate of one of transistors 21 to place such a transistor into a conducting state (ON). At the same time, remaining transistors 21 may be placed in an essentially non-conducting state (OFF). Current may then flow from current source 18 into a wire selected by the ON transistor 21 until a capacitor 20 is charged.

After a predetermined time, a current flow from current source 18 can be stopped, and such a connection to a selected wire of wiring 22 can be set to ground. A charge stored in a capacitor 20 may thus discharge through selected transistor 21 and wire. Of course, such a current flow is in the opposite direction to the initial current flow that can charge a capacitor 20. In this way, a bidirectional current flow may be established in a wiring to thereby improve a service life of such a wiring.

Figure 14:
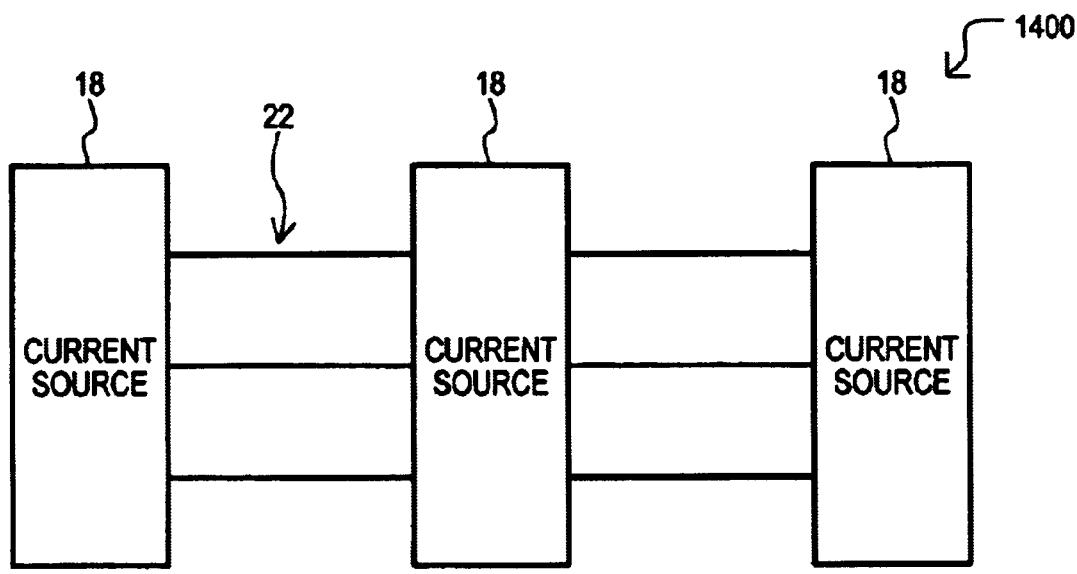
FIG. 14 is a block diagram of a seventh embodiment of the present invention.
Figure 15:
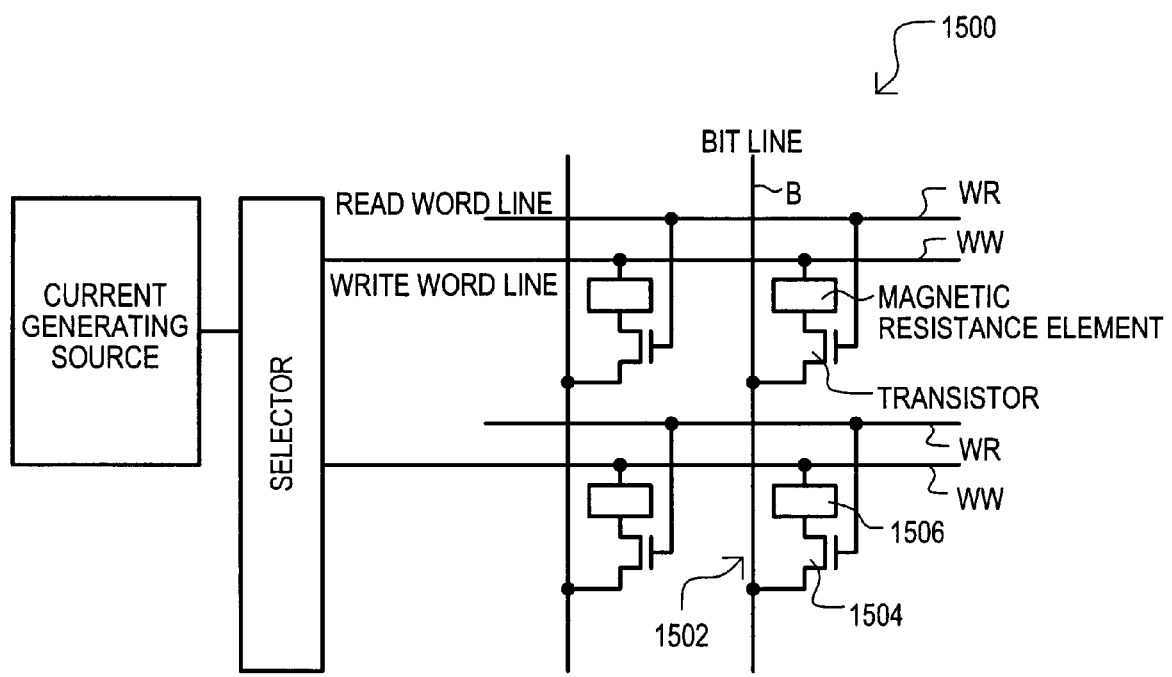
FIG. 15 is a block diagram of a conventional nonvolatile storage device that utilizes magnetic resistance elements.

A structure of a seventh embodiment will now be described with reference to FIG. 14. A sixth embodiment 1300 may include a bidirectional current generating circuit having a number of current sources (or voltage sources) 18 having wirings 22 therebetween. A current source 18 can select a wire of wiring 22 to enable current to flow therethrough or provide a ground connection to such a wiring.

An operating method of a seventh embodiment will now be described. A current source 18 connected at one end of a wire from wiring 22 may connect such a wire to ground, while current source 18 at another end of such a wire may supply a current. To enable a reverse current flow, operations of oppositely connected current sources 18 may be likewise reversed.

In this way, a bidirectional current flow may be established in a wiring to thereby improve a service life of such a wiring.

From the above various embodiments, a current direction for a word line and/or bit line may not be biased for one particular direction. As a result, opens in such conductive lines that may arise from electromigration in a conventional operation, can be prevented.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A nonvolatile storage device, comprising:
   a plurality of word lines;
   a plurality of bit lines;
   a plurality of magnetic resistance elements provided at intersections of the word lines and bit lines;
   a word line control circuit that selects one of the word lines in a write operation and supplies a bidirectional word line write current to the selected word line; and
   a bit line control circuit that selects one of the bit lines in the write operation and supplies a bit line write current to the selected bit line
   wherein in the write operation, the word line control circuit provides the word line write current in one direction and then in a reverse direction.

2. The nonvolatile storage device of claim 1, wherein:
   in the write operation, the word line control circuit provides the word line write current in the one direction for essentially the same amount time that the word line control circuit provides the word line write current in the reverse direction.

3. The nonvolatile storage device of claim 1, wherein:
   the bit line control circuit provides the bit line write current in one direction and then in a reverse direction in the rite operation.

4. The nonvolatile storage device of claim 1, wherein:
   the bit line control circuit comprise a word line—bit line connecting circuit that connects a bit line to a word line in a write operation.

5. The nonvolatile storage device of claim 1, wherein:
   in the write operation, the bit line control circuit provides the bit line write current in a single direction.

6. The nonvolatile storage device of claim 3, wherein:
   in the write operation, the selected word and bit lines are kept at a first potential in a first period and are kept at a second potential different from the first potential in a second period following the first period.

7. The nonvolatile storage device of claim 3, wherein:
   in the write operation, the selected word line is driven to a first potential and the selected bit line is driven to a second potential different from the first potential and then the selected word line is driven to the second potential and the selected bit line is driven to the first potential.

8. The nonvolatile storage device of claim 3, wherein:
   in the write operation, the word line control circuit supplies one of the selected word and bit lines with a corresponding one of the bit and word line write currents, then both of the selected word and bit lines with a corresponding one of the bit and word line write currents, then the other of the selected word and bit lines with a corresponding one of the bit and word line write currents.

9. The nonvolatile storage device of claim 3, wherein:
   a timing when the word line write current changes from the one direction to the reverse direction is different from a timing when the bit line write current changes from the one direction to the reverse direction.

10. A nonvolatile storage device, comprising:
    a plurality of word lines;
    a plurality of bit lines;
    a plurality of magnetic resistance elements provided at intersections of the word lines and bit lines;
    a word line control circuit that selects one of the word lines and supplies a word line write current to the selected word line in a write operation, the word line control circuit reversing the word line write current based on at least one previous word line write current direction; and
    a bit line control circuit that selects one of the bit lines in the write operation and supplies a bit line write current to the selected bit line.

11. The nonvolatile storage device of 10, wherein:
    the word line control circuit includes counter that counts the number of times that a write current of one direction is supplied to the word line, and when the count reaches a predetermined value, resets the counter count and reverses the word line write current direction for the word line.

12. The nonvolatile storage device of 10, wherein:
    the bit line control circuit includes a counter that adds or subtracts a count value according to a direction of a bit line write current, and when the absolute value of the count reaches a predetermined value, a bit line current is provided to bring the count value toward zero.

13. The nenvolatile storage device of 10, wherein:
    the word line control circuit stores a direction of a word line write current supplied to a word line, and reverses the word line write current direction in a next write operation.

14. The nonvolatile storage device of 10, further including:
    a switching device corresponding to each word line that selectively connects each word line to a predetermined supply potential.

15. A method of operating a nonvolatile storage device, comprising the steps of:
    supplying a bidirectional word line write current to a word line selected by a word line control circuit when writing data to a magnetic resistance element formed at an intersection of the word line and bit line; and
    supplying a bit line write current to the bit line, the bit line being selected by a bit line control circuit
    wherein the step of supplying the bidirectional word line write current includes supplying the word line with a word line write current in one direction and then supplying the word line write current in the reverse direction in the same write operation.

16. The method of claim 15, wherein:
    the step of supplying the bit line write current includes supplying the bit line with the bit line write current in one direction and then supplying the bit line write current in the reverse direction in the same write operation.

17. The method of claim 15, wherein:
    the step of supplying the bidirectional word line write current includes supplying the word line with a word line write current in one direction prior to supplying the bit line write current.

18. The method of claim 15, wherein:

the step of supplying the bidirectional word line write current includes coupling the word line to the bit line to supply the bit line write current.

19. A method of operating a nonvolatile storage device, comprising the steps of:

switching a direction of a word line write current in a write operation based on at least one previous word line write current direction when writing data to a magnetic resistance element formed at an intersection of the word line and a bit line; and supplying a bit line write current to the bit line, the bit line being selected by a bit line control circuit.

20. The method of claim 19, wherein:

the step of switching the direction of the word line write current includes counting the number of times that the word line write current flows in one direction, and when the count reaches a predetermined value, resetting the counter count and switching the direction of the word line write current.

21. The method of claim 19, wherein:

the step of switching the direction of the word line write current includes storing the direction of the word line write current supplied to the word line and reversing the word line write current direction in a next write operation.

22. The method of claim 19, wherein:

the step of supplying the bit line write current to the bit line includes supplying the bit line write current in one direction to a first bit line of a bit line pair and providing the bit line write current in an opposite direction to a second bit line of the bit line pair.

23. The method of claim 19, further including:

in a read operation, coupling the bit line to one terminal of a sense amplifying circuit for a predetermined time period, and then writing a predetermined data value with a bidirectional word line current to the bit line, and coupling the bit line to another terminal of the sense amplifying circuit.

* * * * *